(12) United States Patent
Kameyama et al.

(10) Patent No.: US 9,906,748 B2
(45) Date of Patent: Feb. 27, 2018

(54) ANALOG-DIGITAL CONVERSION CIRCUIT DRIVE METHOD, ANALOG-DIGITAL CONVERSION CIRCUIT, IMAGING DEVICE, IMAGING SYSTEM, AND ANALOG-DIGITAL CONVERSION CIRCUIT INSPECTION METHOD

(71) Applicant: CANON KABUSHIKI KAISHA, Tokyo (JP)

(72) Inventors: Hiroaki Kameyama, Kawasaki (JP); Hiroki Hiyama, Sagamihara (JP); Kohichi Nakamura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/730,106

(22) Filed: Jun. 3, 2015

(65) Prior Publication Data
US 2016/0028980 A1   Jan. 28, 2016

(30) Foreign Application Priority Data
Jun. 17, 2014   (JP) .................................. 2014-124751

(51) Int. Cl.
*H04N 5/374*   (2011.01)
*H04N 5/378*   (2011.01)
*H03M 1/10*    (2006.01)
*H03M 1/12*    (2006.01)
*H03M 1/56*    (2006.01)

(52) U.S. Cl.
CPC .......... *H04N 5/378* (2013.01); *H03M 1/1071* (2013.01); *H03M 1/123* (2013.01); *H03M 1/56* (2013.01)

(58) Field of Classification Search
CPC ..................................................... H04N 5/378
USPC ....................................................... 348/294
See application file for complete search history.

(56) References Cited

U.S. PATENT DOCUMENTS

2006/0214821 A1* 9/2006 Roh ..................... H03M 1/1071
341/50
2015/0171884 A1* 6/2015 Tsukuda ................. H04N 5/378
348/308

FOREIGN PATENT DOCUMENTS

JP              2013-65924 A        4/2013

* cited by examiner

*Primary Examiner* — Joel Fosselman
(74) *Attorney, Agent, or Firm* — Canon U.S.A., Inc. IP Division

(57) ABSTRACT

After a signal level of a digital signal is changed in a period in which a plurality of memories is sampling the digital signal, a signal for causing the plurality of memories to hold the digital signal being sampled by the plurality of memories is supplied to the plurality of memories.

20 Claims, 11 Drawing Sheets

ANALOG-DIGITAL CONVERSION CIRCUIT DRIVE METHOD, ANALOG-DIGITAL CONVERSION CIRCUIT, IMAGING DEVICE, IMAGING SYSTEM, AND ANALOG-DIGITAL CONVERSION CIRCUIT INSPECTION METHOD

BACKGROUND OF THE INVENTION

Field of the Invention

The present invention relates to an analog-digital conversion circuit drive method, an analog-digital conversion circuit, an imaging device, an imaging system, and an analog-digital conversion circuit inspection method.

Description of the Related Art

An analog-digital conversion circuit is known that includes a plurality of comparators and a plurality of memories respectively corresponding to the plurality of comparators. Each of the plurality of comparators supplies a comparison result signal indicating the result of comparison of signal levels of an analog signal and a reference signal to the memory corresponding to the comparator.

An analog-digital conversion circuit described in Japanese Patent Application Laid-Open No. 2013-65924 includes a counter that supplies a common count signal to a plurality of memories. Each of the memories start sampling the signal level of the count signal at the timing of change in the signal level of the comparison result signal supplied from the corresponding comparator. After the elapse of a predetermined period from the timing of change in the signal level of the comparison result signal, the signal level of the count signal is held. Thus, each of the plurality of memories holds the count signal input to the memory as a digital signal based on the analog signal input to the comparator.

SUMMARY OF THE INVENTION

According to an embodiment of the present invention, an analog-digital conversion circuit includes a plurality of comparators each configured to output a comparison result signal indicating a result of comparison of an analog signal and a reference signal of which a signal level changes with the elapse of time; a plurality of memories each configured to hold a first digital signal which is based on a period between a start of change in the signal level of the reference signal and a change in the signal level of the comparison result signal, and each provided in correspondence with one of the plurality of comparators; and a signal generation unit configured to supply a second digital signal to the plurality of memories. After the signal generation unit changes a signal level of the second digital signal in a period in which the plurality of memories is sampling the second digital signal, the signal generation unit further supplies to the plurality of memories a signal for causing the plurality of memories to hold the second digital signal being sampled by the plurality of memories.

According to another embodiment, there is provided a method of inspecting an analog-digital conversion circuit including a plurality of comparators each configured to output a comparison result signal indicating a result of comparison of an analog signal and a reference signal of which a signal level changes with the elapse of time, and a plurality of memories each configured to hold a first digital signal based on a period between a start of change in the signal level of the reference signal and a change in the signal level of the comparison result signal, and each provided in correspondence with each of the plurality of comparators.

The analog-digital conversion circuit inspection method includes supplying a second digital signal to the plurality of memories; and, after the signal level of the second digital signal is changed in a period in which the plurality of memories is sampling the second digital signal, supplying to the plurality of memories a signal for causing the plurality of memories to hold the second digital signal being sampled by the plurality of memories.

Further features of the present invention will become apparent from the following description of exemplary embodiments (with reference to the attached drawings).

DESCRIPTION OF THE EMBODIMENTS

In Japanese Patent Application Laid-Open No. 2013-65924, no analysis is made for detecting the memory that does not satisfy the desired characteristics of response to a change in the signal level of the count signal input to the memory. In the embodiments described below, the memory that does not satisfy the desired characteristics of response to a change in the signal level of the count signal input to the memory can be detected in a preferable manner.

In the following, the embodiments will be described with reference to the drawings.

(First Embodiment)

The present embodiment will be described with reference to an imaging device as an example of a device including an analog-digital conversion circuit.

Figure 1:
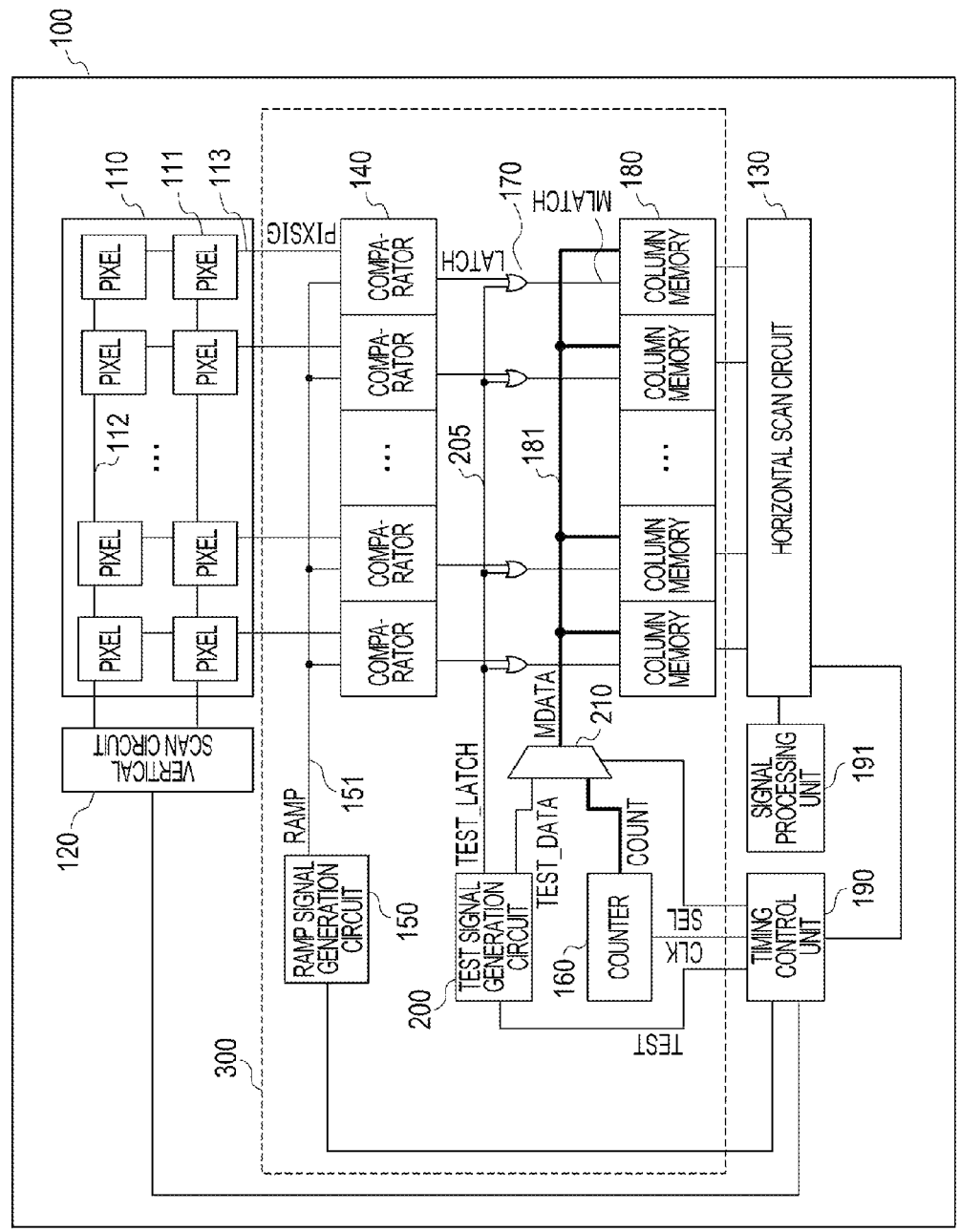
FIG. 1 illustrates an example of the configuration of an A/D conversion circuit and an imaging device.

FIG. 1 illustrates a configuration of the imaging device according to the present embodiment.

The imaging device 100 subjects incident light to photoelectric conversion, and outputs a resultant electric signal as a digital signal. The imaging device 100 includes a pixel array 110, a vertical scan circuit 120, a horizontal scan circuit 130, comparators 140, a ramp signal generation circuit 150, a counter 160, an OR circuits 170, column memories 180, a timing control unit 190, and a signal processing unit 191. The imaging device 100 also includes row control lines 112 and vertical signal lines 113. The imaging device 100 further includes a test signal generation circuit 200 and a selection circuit 210.

The pixel array 110 includes a plurality of pixels 111 including a photoelectric conversion element. The plurality of pixels 111 is disposed in a matrix in the pixel array 110. While in FIG. 1 two rows of pixels 111 are shown, the number of rows of the pixels 111 is not limited to this.

The vertical scan circuit 120 is electrically connected to the plurality of pixels 111 via the plurality of row control lines 112. Each of the row control lines 112 is provided corresponding to one row of pixels 111. The vertical scan circuit 120 is electrically connected to the timing control unit 190. The vertical scan circuit 120 makes the signal level supplied to each of the plurality of row control lines 112 Hi on the basis of the signal supplied from the timing control unit 190. When the signal level of the row control line 112 electrically connected to the pixel 111 becomes Hi, the pixel 111 outputs a PIXSIG signal which is a signal based on the incident light to the vertical signal line 113.

The ramp signal generation circuit 150 generates a ramp signal RAMP. The ramp signal RAMP is a reference signal of which the signal level increases or decreases monotonously as time elapses. The ramp signal generation circuit 150 supplies the ramp signal RAMP to each of the plurality of comparators 140 via a ramp signal line 151. The ramp signal generation circuit 150 is electrically connected to the timing control unit 190. Based on a signal supplied from the timing control unit 190, the ramp signal generation circuit 150 starts a change in the signal level of the ramp signal RAMP as time elapses.

Each of the plurality of comparators 140 is provided corresponding to each of the plurality of vertical signal lines 113 in the pixel array 110. More specifically, one comparator 140 is provided corresponding to one column of the pixels 111. Each of the plurality of comparators 140 is electrically connected to the ramp signal generation circuit 150 and to one of the vertical signal lines 113. Each of the plurality of comparators 140 is electrically connected to each of the plurality of OR circuits 170. Each of the plurality of comparators 140 outputs a signal LATCH to each of the plurality of OR circuits 170. The signal LATCH is a signal that becomes Hi for a predetermined period from the timing at which the signal level of the ramp signal RAMP has become greater than the signal level of the PIXSIG signal. Namely, the signal LATCH is a signal of which the signal level is changed by a change in the result of comparison performed by the comparators 140.

The plurality of OR circuits 170 is electrically connected to the test signal generation circuit 200 via a test signal supply line 205. The test signal generation circuit 200 supplies a signal TEST_LATCH to the plurality of OR circuits 170 via the test signal supply line 205. The signal TEST_LATCH is a test latch signal.

Each of the plurality of OR circuits 170 supplies a Hi signal MLATCH to the corresponding column memories 180 when one of the signal LATCH and the signal TEST_LATCH becomes Hi.

The test signal generation circuit 200 is electrically connected to the selection circuit 210. The test signal generation circuit 200 supplies a signal TEST_DATA to the selection circuit 210. The test signal generation circuit 200 is electrically connected to the timing control unit 190. When the signal TEST supplied from the timing control unit 190 becomes Hi, the test signal generation circuit 200 initially makes the signal TEST_DATA Hi and then makes the signal TEST_LATCH Hi.

The selection circuit 210 is electrically connected to the counter 160. The counter 160 supplies a signal COUNT to the selection circuit 210. The signal COUNT is a count signal generated by the counter 160 counting the signal CLK supplied from the timing control unit 190 to the counter 160. The signal CLK is a clock signal. The test signal generation circuit 200 is a signal generation unit that supplies the signal TEST_DATA and the signal TEST_LATCH to the plurality of column memories 180.

The selection circuit 210 is also electrically connected to the timing control unit 190. The timing control unit 190 supplies a signal SEL to the selection circuit 210.

The selection circuit 210 is also electrically connected to the plurality of column memories 180 via a data signal line 181. Based on the signal level of the signal SEL, the selection circuit 210 selects one of the signal TEST_DATA and the signal COUNT as a signal MDATA supplied to the data signal line 181.

Each of the plurality of column memories 180 is electrically connected to each of the plurality of OR circuits 170. Each of the plurality of column memories 180 is electrically connected to the horizontal scan circuit 130.

The horizontal scan circuit 130 is electrically connected to the timing control unit 190. The horizontal scan circuit 130, on the basis of the signal supplied from the timing control unit 190, sequentially selects the plurality of column memories 180. Thus, the signal held by each of the plurality of column memories 180 is sequentially transferred to the signal processing unit 191.

The analog-digital conversion circuit (hereafter referred to as "A/D conversion circuit") 300 includes the plurality of comparators 140, the ramp signal generation circuit 150, the counter 160, the plurality of OR circuits 170, the plurality of column memories 180, a test signal generation circuit 200, and the selection circuit 210.

Figure 2A:
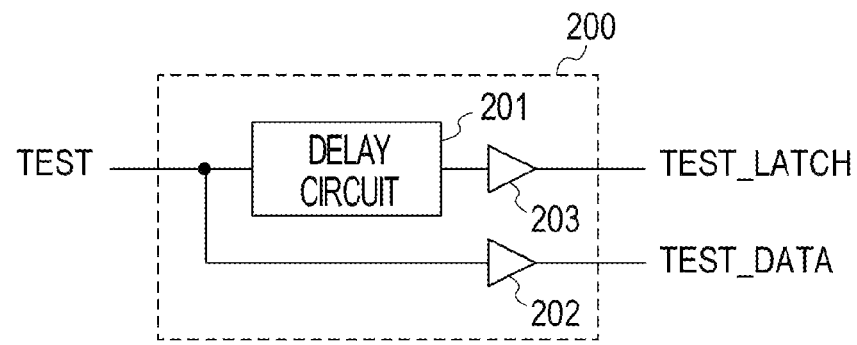
FIGS. 2A-B illustrate an example of the configuration of a test signal generation circuit, and an example of the configuration of a selection circuit.

FIG. 2A illustrates a configuration of the test signal generation circuit 200. The test signal generation circuit 200 includes a delay circuit 201, a buffer 202, and a buffer 203. The signal TEST supplied from the timing control unit 190 is input to the delay circuit 201 and the buffer 202. The delay circuit 201 supplies to the buffer 203 a signal that becomes Hi after the elapse of a predetermined period tdelay following the signal level of the signal TEST becoming Hi. The signal supplied by the buffer 203 is the signal TEST_LATCH. The signal supplied by the buffer 202 is the signal TEST_DATA.

Figure 2B:
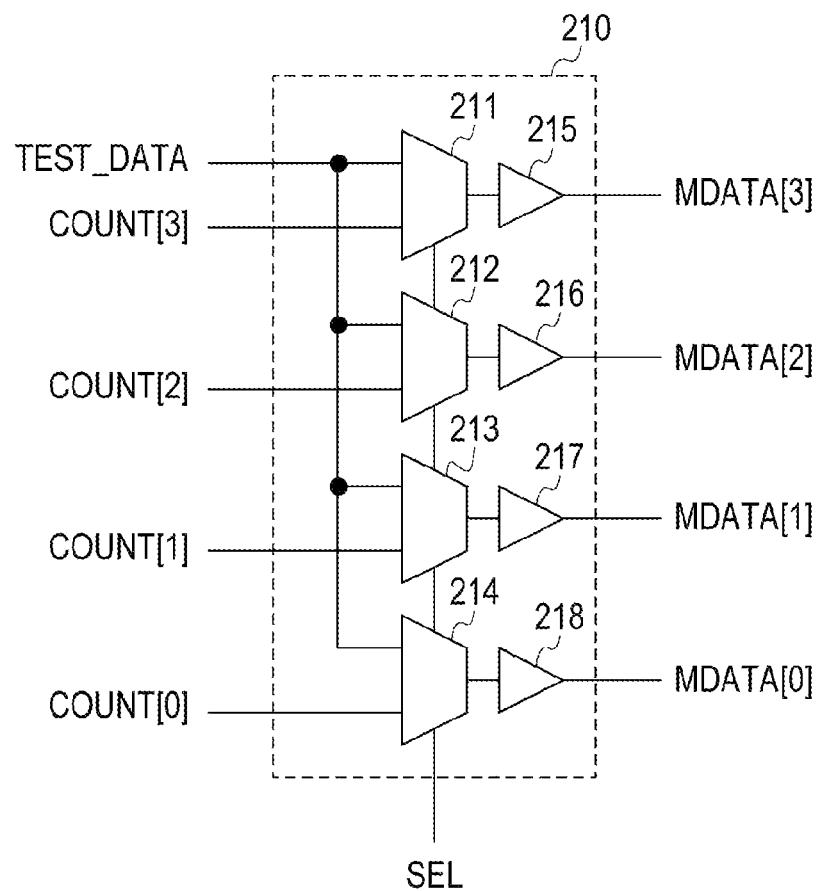

FIG. 2B illustrates a configuration of the selection circuit 210. The selection circuit 210 includes a plurality of bit signal selection circuits 211 to 214, and a plurality of buffers 215 to 218. To each of the plurality of bit signal selection circuits 211 to 214, there are selectively input each of signals COUNT [0] to [3] which are signals of each bit of the signal COUNT, and the signal TEST_DATA. When the signal level of the signal SEL supplied from the timing control unit 190 is Lo, each of the plurality of bit signal selection circuits 211 to 214 outputs the signals COUNT [3] to [0] to the plurality of buffers 215 to 218 respectively. On the other hand, when the signal level of the supplied signal SEL supplied from the timing control unit 190 is Hi, each of the plurality of bit signal selection circuits 211 to 214 outputs the signal TEST_DATA to each of the plurality of buffers 215 to 218. Each of the plurality of bit signal selection circuits 211 to 214 supplies a signal to the corresponding one of the plurality of buffers 215 to 218. Each of the plurality of buffers 215 to 218 outputs, as signals MDATA [3] to [0], a signal obtained by buffering the signal output from the corresponding one of the plurality of bit signal selection circuits 211 to 214. The signals MDATA [3] to [0] in FIG. 2B correspond to the signal MDATA shown in FIG. 1.

Figure 3:
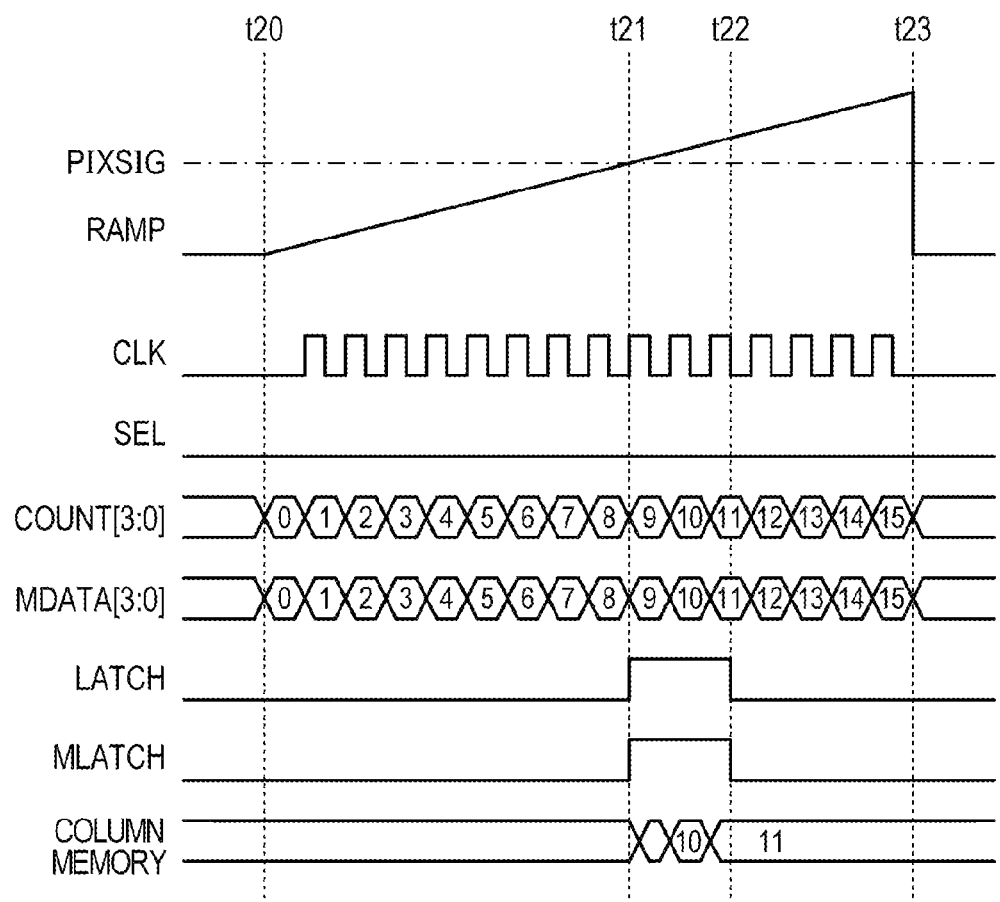
FIG. 3 illustrates an example of the operation of the A/D conversion circuit and the imaging device.

With reference to FIG. 3, an operation of the imaging device shown in FIG. 1 will be described. The signals shown in FIG. 3 correspond to the signals shown in FIG. 1. FIG. 3 is a timing chart in the case where the imaging device, as a normal operation, generates a digital signal based on the incident light. The signal level of the signal TEST_LATCH, which is not shown in FIG. 3, is Lo during the operation of FIG. 3. Each of the signal COUNT and the signal MDATA shown in FIG. 3 is a 4-bit digital signal. The "column memory" noted in FIG. 3 indicates the digital signal held by the column memories 180. In FIG. 3, for the sake of ease of description, each of the signal COUNT, the signal MDATA, and the signals held by the column memories 180 is represented by a decimal value. In FIG. 3, the signals denoted by the decimal values are actually signals represented by binary numbers.

At time t20, the timing control unit 190 makes the signal level of the signal SEL Lo. Also at time t20, the pixels 111 electrically connected to the row control line 112 to which Hi signal is being supplied output the PIXSIG signal to the vertical signal lines 113.

At time t20, under the control of the timing control unit 190, the ramp signal generation circuit 150 starts a change in the signal level of the ramp signal RAMP over time.

Also at time t20, the counter 160 starts counting the signal CLK supplied from the timing control unit 190.

Because the signal level of the signal SEL is Lo, the selection circuit 210 supplies the signal COUNT supplied by the counter 160 to each of the plurality of column memories 180 via the data signal line 181.

At time t21, the magnitude relationship in signal level between the PIXSIG signal being output from the pixels 111 to the vertical signal lines 113 and the ramp signal RAMP is reversed. Thus, the signal level of the signal LATCH becomes Hi. Accordingly, the signal level of the signal MLATCH becomes Hi. Then, the signal level of the signal LATCH becomes Lo at time t22 after having been Hi for a predetermined period. Thus, the signal level of the signal MLATCH also becomes Lo. The column memories 180 hold the signal level of the signal COUNT when the signal level of the signal MLATCH became Lo. Each of the plurality of column memories 180 are memories that hold a digital signal based on an analog signal. The signal COUNT based on the period between the start of signal level change in the ramp signal RAMP as the reference signal and the change in the signal level of a comparison result signal is the count signal based on the period between time t20 and time t22.

At time t23, the ramp signal generation circuit 150 ends the change in signal level of the ramp signal RAMP over time.

Thereafter, the horizontal scan circuit 130 sequentially scans the plurality of column memories 180. Thus, from each of the plurality of column memories 180, the signal held by each of the plurality of column memories 180 is sequentially output to the signal processing unit 191.

An operation of inspecting the plurality of column memories 180 will be described.

Figure 4:
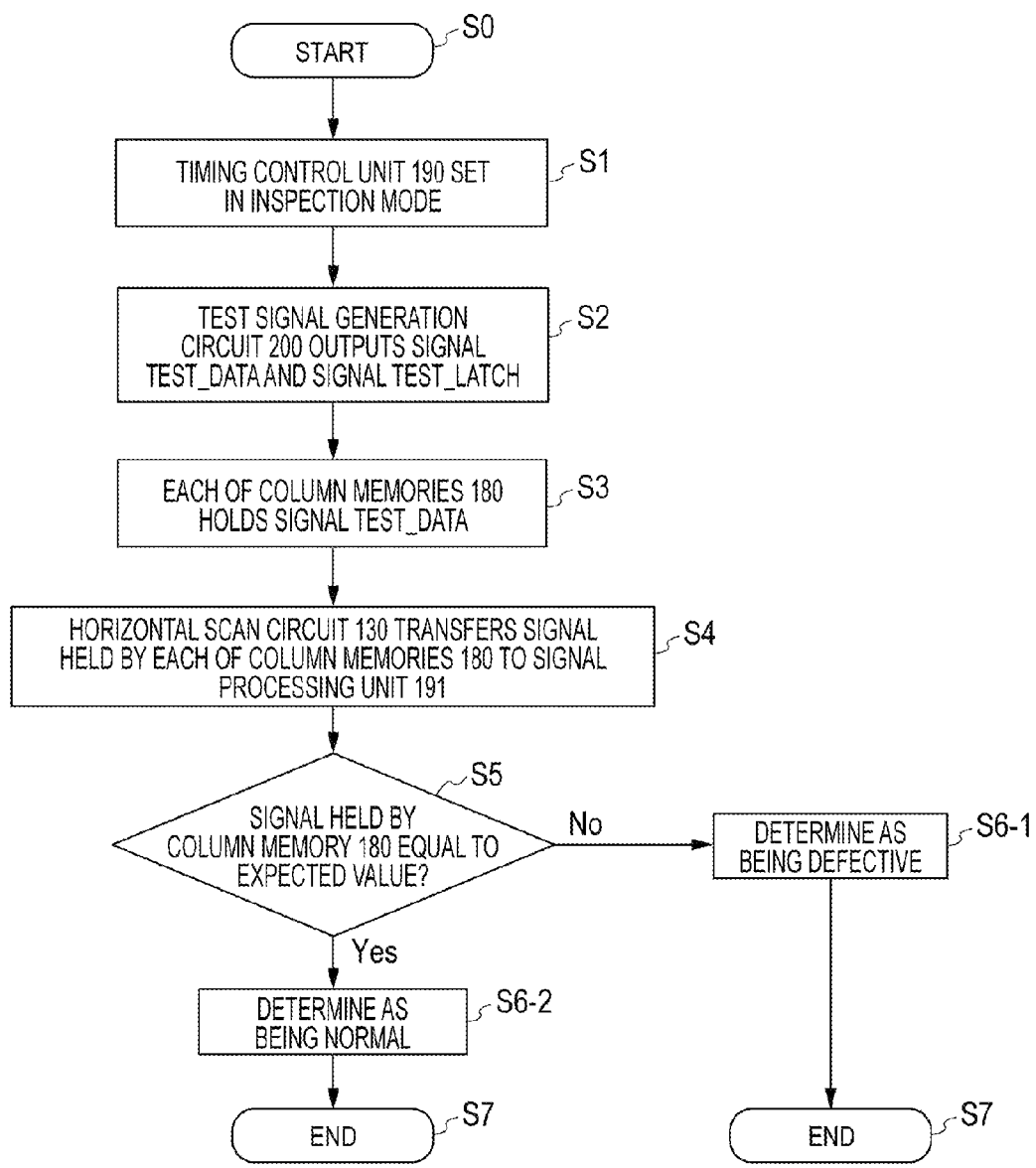
FIG. 4 is a flowchart of an example of inspection mode.

FIG. 4 is a flowchart of the operation relating to the inspection of the plurality of column memories 180.

In step S1, the timing control unit 190 is set in inspection mode by an instruction signal from outside the imaging device 100.

In step S2, the test signal generation circuit 200 supplies the signal TEST_DATA and the signal TEST_LATCH so that each of the plurality of column memories 180 holds an expected value. The signal TEST_DATA and the signal TEST_LATCH are inspection signals used for the inspection of the plurality of column memories 180.

In step S3, each of the plurality of column memories 180 holds the signal TEST_DATA on the basis of the inspection signal.

In step S4, the horizontal scan circuit 130 transfers the signal held by each of the plurality of column memories 180 to the signal processing unit 191 from the each of the plurality of column memories 180.

In step S5, the signal processing unit 191 compares the expected value which is the signal level to be held by each of the plurality of column memories 180, and the actual signal level held by each of the plurality of column memories 180. When the actual signal level held by the column memory 180 and the expected value agree, the signal processing unit 191 proceeds to step S6-1, and determines that the column memory 180 that has held the same signal level as the expected value as being "normal". On the other hand, when the signal value of the signal held by any of the plurality of column memories 180 and the expected value do not agree, the signal processing unit 191 proceeds to step S6-2 and determines that the column memory 180 that has held the signal of a signal value different from the expected value as being "defective".

Figure 5:
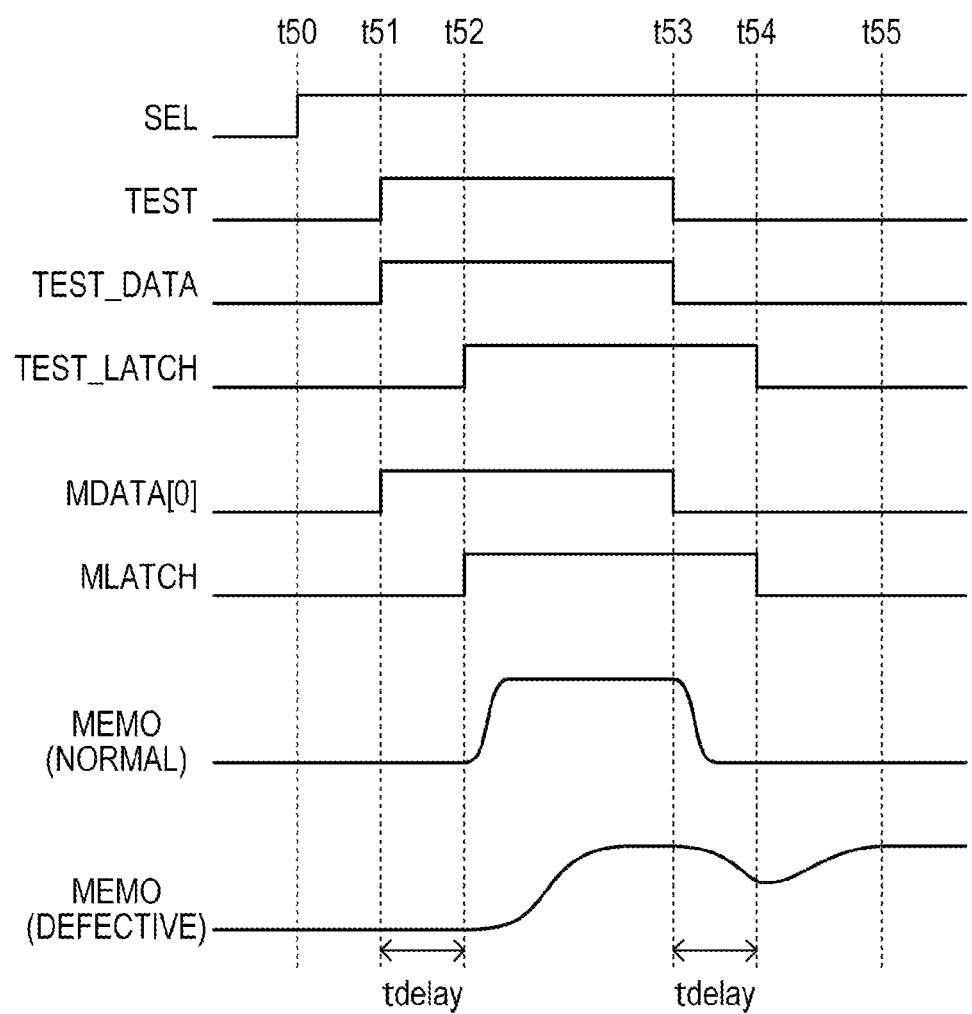
FIG. 5 illustrates an example of the operation of the A/D conversion circuit and the imaging device.

FIG. 5 is a flowchart of the operation relating to the inspection of the plurality of column memories 180. In FIG. 5, "MEMO" indicates the signal of the least significant bit of the signal held by the column memories 180.

At time t50, step S2 of FIG. 4 is completed.

At time t50, the timing control unit 190 makes the signal level of the signal SEL Hi. Thus, the selection circuit 210 supplies the signal MDATA generated using the signal TEST_DATA to the plurality of column memories 180 via the data signal line 181.

At time t51, the timing control unit 190 makes the signal level of the signal TEST Hi. Thus, the signal level of the signal TEST_DATA supplied by the test signal generation circuit 200 becomes Hi. Accordingly, the signal level of the signal MDATA becomes Hi. In FIG. 5, the signal MDATA [0] which is the least significant bit of the signal MDATA is shown.

The signal level of the signal TEST_LATCH supplied by the test signal generation circuit 200 becomes Hi at time t52 after the elapse of a predetermined period tdelay due to the operation of the delay circuit 201, following the signal level of the signal TEST_DATA becoming Hi. Thus, the signal level of the signal MLATCH supplied by each of the plurality of OR circuits 170 becomes Hi. The signal TEST_LATCH having the Hi signal level is a signal for causing the column memories 180 to start sampling the signal MDATA supplied by the selection circuit 210 and generated using the signal TEST_DATA.

At time t53, the timing control unit 190 makes the signal level of the signal TEST Lo. Thus, the signal level of the signal TEST_DATA becomes Lo. The signal TEST_LATCH supplied by the test signal generation circuit 200 becomes Lo at time t54 after the elapse of a predetermined period tdelay due to the operation of the delay circuit 201, following the signal level of the signal TEST_DATA becoming Lo. Thus, at time t54, the signal level of the signal MLATCH becomes Lo. The signal TEST_LATCH of which the signal level has transitioned from Hi to Lo is a signal for causing the column memories 180 to hold the signal MDATA generated using the signal TEST_DATA supplied by the selection circuit 210.

A case where the column memories 180 have good response will be described. In a period between time t53 at which the signal TEST_DATA became Lo and time t54 at which the signal MLATCH became Lo, the column memories 180 respond such that the signal level of the MEMO becomes Lo in correspondence with the signal TEST_DATA of the Lo signal level.

When the response of the column memories 180 is not sufficient, the signal level of the MEMO does not become Lo in the period between time t53 at which the signal TEST_DATA became Lo and time t54 at which the signal MLATCH became Lo. Thus, when the response of the column memories 180 is not sufficient, the MEMO of the column memories has Hi signal level.

Thereafter, the horizontal scan circuit 130 sequentially scans the plurality of column memories 180. Thus, from each of the plurality of column memories 180, the signal held by each of the plurality of column memories 180 is sequentially output to the signal processing unit 191.

The signal processing unit 191 compares an expected value which is the signal level to be held by each of the plurality of column memories 180 and the signal level actually output from each of the plurality of column memories 180. The expected value is a value that is set in the signal processing unit 191 in advance by a control signal from outside the imaging device 100. The signal processing unit 191 then determines that the column memory 180 that has output a signal with a signal value different from the signal level to be held as being "defective". On the other hand, the signal processing unit 191 determines that the column memory 180 that has output a signal with the same signal level as the signal value to be held as being "normal".

According to the present embodiment, the A/D conversion circuit 300 makes the signal level of the signal TEST_DATA from Hi to Lo and then makes the signal MLATCH from Hi to Lo after the elapse of a first period which is the predetermined period tdelay. Thus, the defective column memories 180 in which the signal being held does not transition from Hi to Lo in the first period, and the normal column memories 180 in which the signal being held transitions from Hi to Lo in the first period can be identified. Thus, according to the present embodiment, the A/D conversion circuit 300 can detect the column memories 180 having low response with respect to a change in the signal level of the signal COUNT as the count signal. The predetermined period tdelay as the first period may be set to an arbitrary length. For example, when the A/D conversion circuit 300 is provided with a plurality of operation modes, the length of the predetermined period tdelay may be set in accordance with the mode with the shortest period in which the signal LATCH becomes Hi.

In order to shorten the A/D conversion period, the frequency of the signal CLK may be increased. In the A/D conversion circuit 300, after the magnitude relationship between the ramp signal RAMP and the PIXSIG signal is reversed, the period in which the signal level of the signal LATCH is made from Lo to Hi and then made Lo may be determined by the cycle of the signal CLK. In this case, as the frequency of the signal CLK increases, the period in which the signal level of the signal LATCH is Hi becomes shorter. When the period in which the signal level of the signal LATCH is Hi becomes shorter, the defective column memories 180 will hold a signal with a signal value different from the signal that should be held.

According to the present embodiment, even when the clock frequency of the A/D conversion circuit 300 is increased, the A/D conversion circuit 300 can detect defective column memories 180.

The imaging device 100 according to the present embodiment may further include an amplifier unit that outputs, to the comparators 140, a signal obtained by amplifying the PIXSIG signal output to the vertical signal lines 113.

In the present embodiment, the ramp signal RAMP is a signal of which the signal level changes in sloping shape with the elapse of time. The ramp signal RAMP may be a signal of which the signal level changes in stepped shape with the elapse of time. The ramp signal RAMP of which the signal level changes in stepped shape is also a reference signal of which the signal level changes with the elapse of time.

In the present embodiment, the description has been made by focusing on the signal of the least significant bit of all the signals held by the column memories 180. However, the inspection of the column memories 180 may be performed with respect to all bits of the column memories 180. It should be noted, however, that in the column memories 180, the bit memory that holds the least significant bit has a shorter cycle of transition between the signal levels Hi and Lo compared with the bit memories that hold other bits. Thus, it is preferable to perform the inspection of the column memories 180 with respect to the bit memory that holds the signal of the least significant bit.

In the present embodiment, an example has been described in which the signal processing unit 191 that makes the normal/defective determination of the column memories 180 is provided in the imaging device 100. However, the signal processing unit 191 that makes the normal/defective determination of the column memories 180 may be included in the A/D conversion circuit 300 or provided externally of the imaging device 100.

In the present embodiment, the selection circuit 210 supplies the signal MDATA based on the signal TEST input from the timing control unit 190. In another example, instead of the signal TEST_DATA, which is one of inspection signals, the signal COUNT input from the counter 160 may be supplied to the data signal line 181.

In the present embodiment, the expected value is a signal set by a control signal from outside the imaging device 100. The expected value may be a value written in advance into the signal processing unit 191 as a fixed value, or a value that is variously set by the control signal from outside the imaging device 100.

(Second Embodiment)

The imaging device 100 including an A/D conversion circuit 310 and an A/D conversion circuit 310 according to the present embodiment will be described, focusing mainly on differences from the first embodiment.

Figure 6:
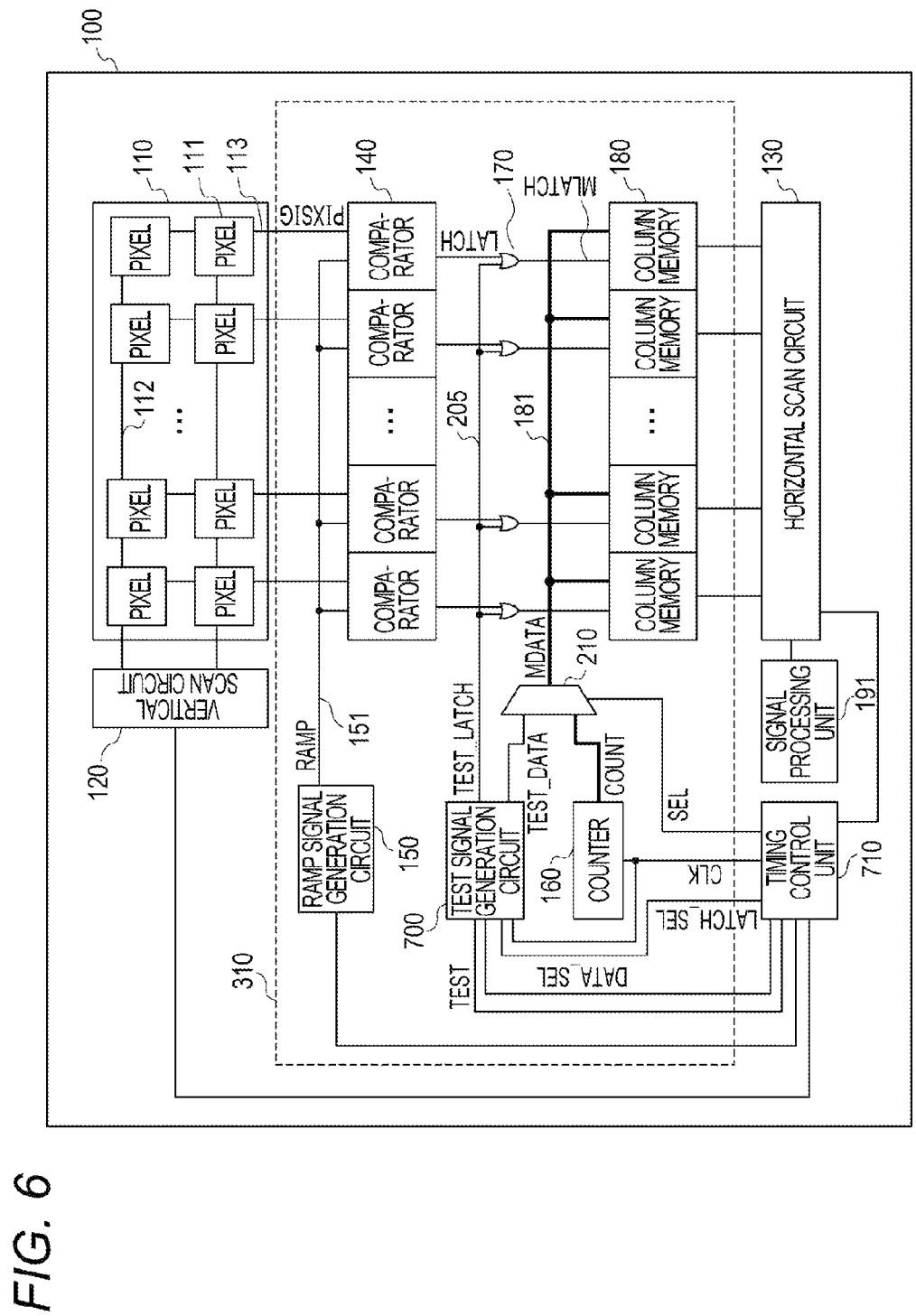
FIG. 6 illustrates an example of the configuration of the A/D conversion circuit and the imaging device.

FIG. 6 illustrates a configuration of the imaging device 100 according to the present embodiment. Members with the same functions as those of the members shown in FIG. 1 are designated in FIG. 6 with the same signs as in FIG. 1.

In the imaging device 100 according to the present embodiment, a timing control unit 710 supplies a signal DATA_SEL and the signal LATCH_SEL to a test signal generation circuit 700. The timing control unit 710 also supplies the signal CLK supplied to the counter 160 also to the test signal generation circuit 700. Namely, the same signal CLK as the signal CLK supplied to the counter 160 is supplied to the test signal generation circuit 700. Accordingly, the imaging device 100 according to the present embodiment can synchronize the operation of the test signal generation circuit 700 and the operation of the counter 160.

Figure 7A:
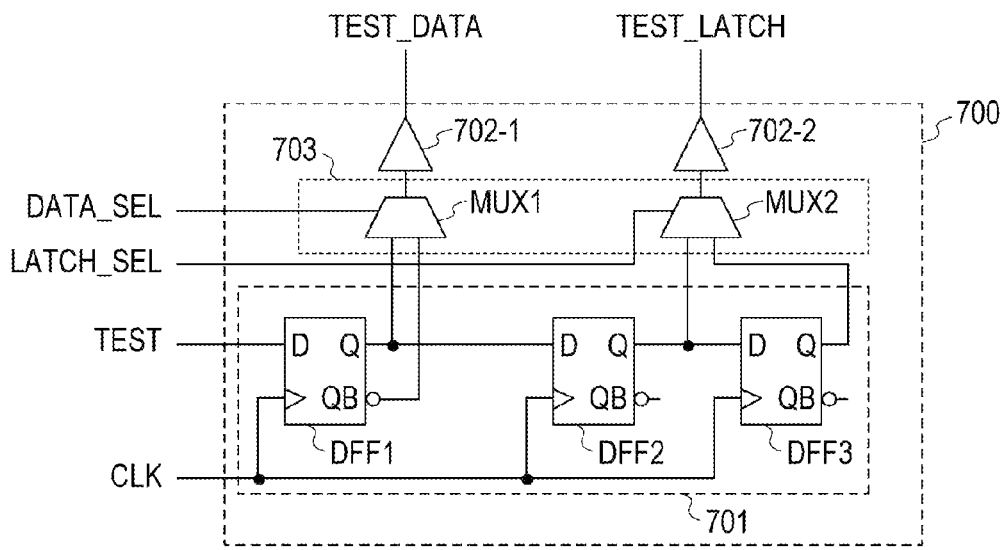
FIGS. 7A-B illustrate an example of the configuration of the test signal generation circuit, and an example of the operation of the test signal generation circuit.

FIG. 7A illustrates a configuration of the test signal generation circuit 700 according to the present embodiment. A delay circuit 701 includes a flip-flop circuit (hereafter referred to as "FF circuit") DFF1, a FF circuit DFF2, and a FF circuit DFF3. The signal level at output Q of FF circuit DFF2 becomes Hi with a delay of one cycle of the signal CLK after the signal level at output Q of the FF circuit DFF1 became Hi. The signal level at output Q of the FF circuit DFF3 becomes Hi with a delay of one cycle of the signal CLK after the signal level at output Q of the FF circuit DFF2 became Hi. Namely, the signal level at output Q of the FF circuit DFF3 becomes Hi with a delay of two cycles of the signal CLK after the signal level at output Q of the FF circuit DFF1 became Hi.

The test signal generation circuit 700 includes MUX1 and MUX2 which are multiplexer circuits. The test signal generation circuit 700 also includes an output buffer 702-1 and an output buffer 702-2. The signal DATA_SEL supplied by the timing control unit 710 is input to MUX1 included in the selection circuit 703. The signal LATCH_SEL supplied by the timing control unit 710 is input to MUX2 included in the selection circuit 703. When the signal level of the signal DATA_SEL is Lo, MUX1 supplies the output Q of the FF circuit DFF1 to the output buffer 702-1. When the signal level of the signal DATA_SEL is Hi, MUX1 supplies the output QB of the FF circuit DFF1, which is an inverted signal of the output Q of the FF circuit DFF1, to the output buffer 702-1. When the signal level of the signal LATCH_SEL is Lo, MUX2 supplies the output Q of the FF circuit DFF2 to the output buffer 702-2. When the signal level of the signal LATCH_SEL is Hi, MUX2 supplies the output Q of the FF circuit DFF3 to the output buffer 702-2.

Figure 7B:
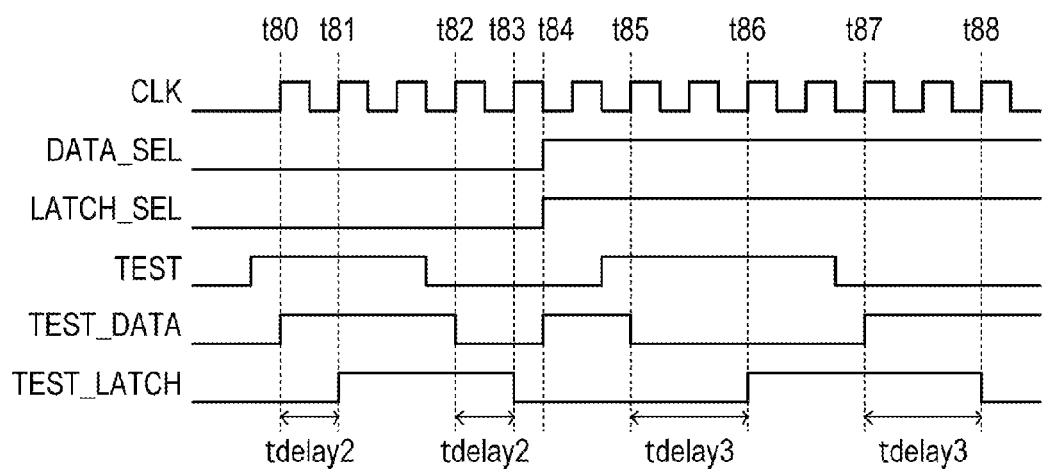

FIG. 7B is a timing chart of the operation of the test signal generation circuit 700 shown in FIG. 7A. The signals shown in FIG. 7B correspond to the signals shown in FIG. 7A. The timing chart of FIG. 7B is a diagram for describing the relationship between the signal input to the test signal generation circuit 700 shown in FIG. 7A and the operation of the test signal generation circuit 700.

At time t80, the timing control unit 710 makes the signal level of the signal TEST Hi. The timing control unit 710 also starts oscillation of the signal CLK at time t80. Thus, the signal level of the output Q of the FF circuit DFF1 becomes Hi at time t80. The timing control unit 710 has the signal level Lo of the signal DATA_SEL. Thus, MUX1 supplies the output Q of the FF circuit DFF1 to the output buffer 702-1. Accordingly, the signal level of the signal TEST_DATA output from the output buffer 702-1 becomes Hi at time t80.

The signal level of the output Q of the FF circuit DFF2 becomes Hi at time t81. The timing control unit 710, at time t81, makes the signal level of the signal LATCH_SEL Lo. Thus, MUX2 supplies the output Q of the FF circuit DFF2 to the output buffer 702-2. Accordingly, the signal level of the signal TEST_LATCH output from the output buffer 702-2 becomes Hi at time t81.

Thereafter, the timing control unit 710 makes the signal level of the signal TEST Lo. Thus, the signal level of the signal TEST_DATA becomes Lo at time t82. Then, at time t83, the signal level of the signal TEST_LATCH becomes Lo. The period from time t80 to time t81 and the period from time t82 to time t83 are a period tdelay2 of the same length.

At time t84, the timing control unit 710 makes the signal DATA_SEL Hi. Thus, MUX1 supplies the output QB of the FF circuit DFF1 to the output buffer 702-1. Because the signal level of the signal TEST is Lo, the signal level of the output QB of the FF circuit DFF1 is Hi. Thus, the signal level of the signal TEST_DATA becomes Hi at time t84.

Thereafter, the timing control unit 710 makes the signal level of the signal TEST Hi. Then, the signal level of the signal CLK becomes Hi at time t85, and the signal level of the output QB of the FF circuit DFF1 becomes Lo. Thus, the signal level of the signal TEST_DATA output from the output buffer 702-1 becomes Lo.

The timing control unit 710, at time t84, makes the signal level of the signal LATCH_SEL Hi. Thus, MUX2 supplies the output Q of the FF circuit DFF3 to the output buffer 702-2.

Because the signal level of the signal TEST is Lo, the signal level of time the output Q of the FF circuit DFF1 becomes Hi at t85. Thus, the output Q of the FF circuit DFF3, i.e., the signal level of the signal TEST_LATCH, becomes Hi at time t86 which is delayed from time t85 by two cycles of the signal CLK.

Thereafter, the timing control unit 710 makes the signal level of the signal TEST Lo. Then, at time t87 at which the signal level of the signal CLK becomes Hi, the signal level of the output QB of the FF circuit DFF1 becomes Hi. Thus, the signal level of the signal TEST_DATA output from the output buffer 702-1 becomes Hi.

At time t87, the signal level of the output Q of the FF circuit DFF1 becomes Lo. Thus, the signal level of the output Q of the FF circuit DFF3, i.e., the signal level of the signal TEST_LATCH, becomes Lo at time t88 which is delayed from time t87 by two cycles of the signal CLK.

The period from time t85 to time t86, and the period from time t87 to time t88 are a period tdelay3 of the same length. The period tdelay3 is longer than the period tdelay2 by one cycle of the signal CLK. In the present embodiment, the period tdelay3 is a period with twice the length of the period tdelay2.

When the signal levels of both the signal DATA_SEL and the signal LATCH_SEL are Lo, the signal level of the signal TEST_LATCH becomes Lo after the elapse of the period tdelay2 following the signal level of the signal TEST_DATA having become Lo. Thus, according to the present embodiment, the A/D conversion circuit 310 can conduct an inspection as to whether the signal level of the MEMO, which is the signal held by the column memories 180, transitions from Hi to Lo within the period tdelay2.

When the signal levels of both the signal DATA_SEL and the signal LATCH_SEL are Hi, the signal level of the signal TEST_LATCH becomes Lo after the elapse of the period tdelay3 following the signal level of the signal TEST_DATA becoming Hi. Thus, it can be inspected whether the signal level of the MEMO, which is the signal, held by the column memories 180, transitions from Lo to Hi within the period tdelay3.

Depending on the combination of the signal levels of the signal DATA_SEL and the signal LATCH_SEL, various inspections may be conducted with regard to the column memories 180. Table 1 shown below indicates the relationship between the signal level of the signal DATA_SEL, the signal level of the signal LATCH_SEL, and inspection of the column memories 180. The contents of Table 1 will be described. In Table 1, for example, in the column where the signal level of the signal DATA_SEL and the signal level of the signal LATCH_SEL are both Hi, it is noted "period tdelay3 Lo→Hi". The notation indicates that whether the signal level of the MEMO which is the signal held by the column memories 180 transitions from Hi to Lo within the period tdelay3.

TABLE 1

| | | Signal level of signal DATA_SEL | |
|---|---|---|---|
| | | Hi | Lo |
| Signal level of signal LATCH_SEL | Hi | Period tdelay3 Lo → Hi | Period tdelay3 Hi → Lo |
| | Lo | Period tdelay2 Lo → Hi | Period tdelay2 Hi → Lo |

The operation relating to the inspection of the column memories 180 in the imaging device 100 according to the present embodiment as shown in FIG. 6 may be the same as the operation illustrated in FIG. 5. The inspection of the column memories 180 may be conducted by selecting the respective signal levels of the signal DATA_SEL and the signal LATCH_SEL in accordance with the contents of the inspection of the column memories 180 as shown in Table 1.

Thus, the A/D conversion circuit 310 according to the present embodiment can inspect the plurality of column memories 180 during signal level transition of the column memories 180 both from Lo to Hi and from Hi to Lo. The A/D conversion circuit 310 according to the present embodiment can also conduct inspection as to whether the signal level of the signal held by the plurality of column memories 180 transitions in each of the period tdelay2, which is the first period, and the period tdelay3, which is the second period longer than the first period, according to the present embodiment.

In the present embodiment, the period tdelay2 has the length corresponding to one cycle of the signal CLK, and the period tdelay3 has the length corresponding to two cycles of the signal CLK. The lengths of the period tdelay2 and the period tdelay3 are not limited to these examples, and the period tdelay3 may be longer than the period tdelay2. For example, the test signal generation circuit 700 further includes a FF circuit that receives the output Q of the FF circuit DFF3 at D terminal. MUX2 may be configured to supply the output Q of the FF circuit that receives the output Q of the FF circuit DFF3 at D terminal to the output buffer 702-2 so that the period tdelay3 has the length corresponding to three cycles of the signal CLK.

(Third Embodiment)

An A/D conversion circuit according to the present embodiment and an imaging device including the A/D conversion circuit will be described, mainly focusing on differences from the first embodiment.

Figure 8:
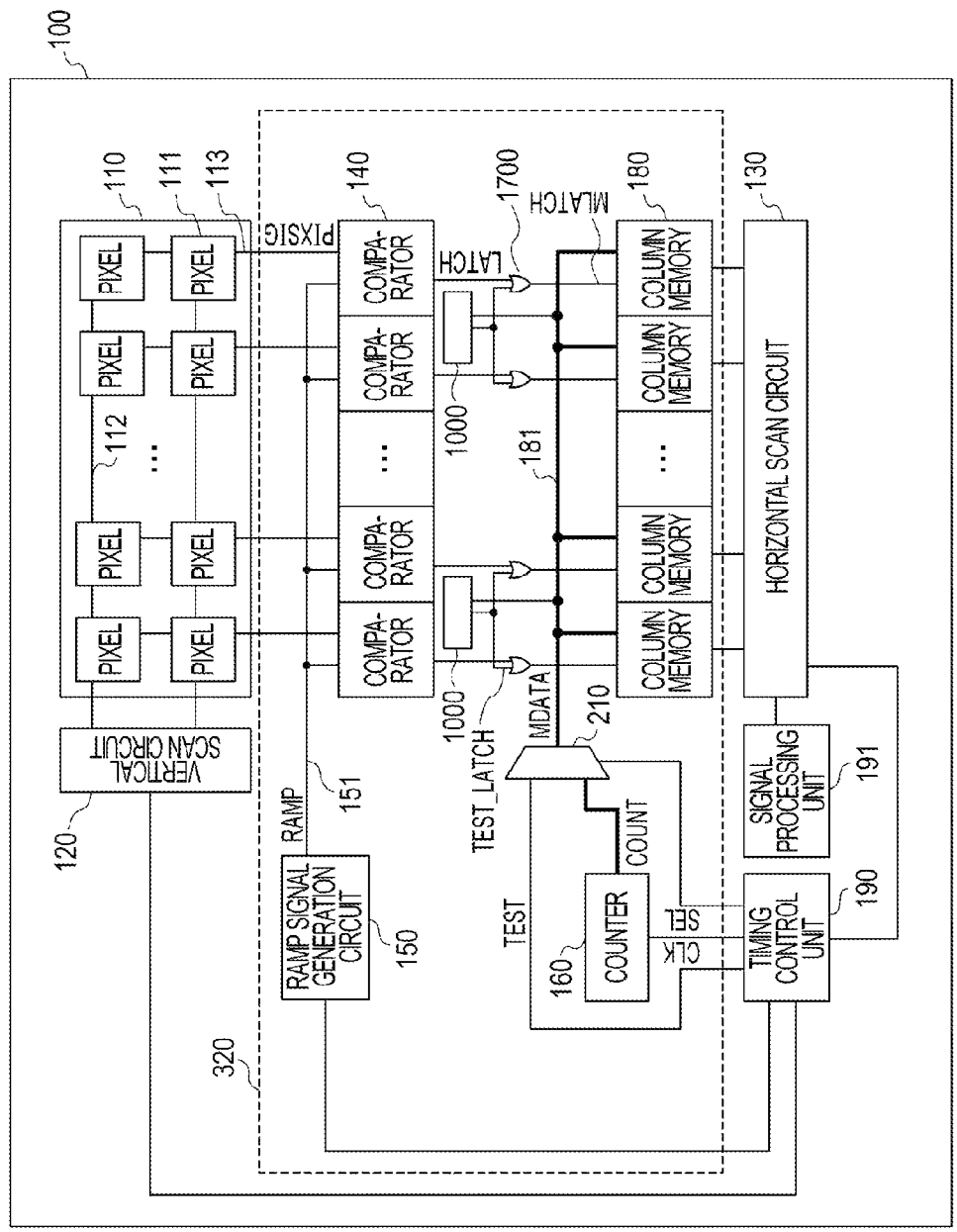
FIG. 8 illustrates an example of the configuration of the A/D conversion circuit and the imaging device.

FIG. 8 illustrates a configuration of the imaging device according to the present embodiment. Members having the same functions as those of the members shown in FIG. 1 are designated in FIG. 8 with the same signs as in FIG. 1. The configuration of the selection circuit 210 is the same as the configuration shown in FIG. 2B with the exception that, instead of the signal TEST_DATA, the signal TEST is input from the timing control unit 190.

The A/D conversion circuit 320 includes test signal generation circuits 1000 and OR circuits 1700. The OR circuits 1700 supply a Hi signal MLATCH to the column memories 180 when one of the signal TEST_LATCH output from the test signal generation circuits 1000 and the signal LATCH output from the comparators 140 becomes Hi. To the test signal generation circuits 1000, the signal MDATA supplied by the selection circuit 210 is input. According to the present embodiment, the A/D conversion circuit 320 includes a plurality of sets of two columns of comparators 140 with a corresponding one of the test signal generation circuits 1000. The plurality of test signal generation circuits 1000 each of which supplies the signal TEST_LATCH to the corresponding column memories 180, and the selection circuit 210 that supplies the signal MDATA on the basis of the signal TEST supplied by the timing control unit 190 constitute a signal generation unit according to the present embodiment. Each of the plurality of test signal generation circuits 1000 that each supply the signal TEST_LATCH, i.e., a test latch signal, constitutes a test latch signal supply unit according to the present embodiment. The selection circuit 210 that supplies the signal MDATA, i.e., a test digital signal, constitutes a test digital signal supply unit according to the present embodiment.

In the A/D conversion circuit 320 shown in FIG. 8, the signal TEST supplied by the timing control unit 190 is input to the selection circuit 210.

The operation of the A/D conversion circuit 320 according to the present embodiment may be the same as the operation illustrated in FIG. 5 with regard to the inspection of the column memories 180. The test signal generation circuits 1000 make the signal level of the signal TEST_LATCH from Hi to Lo after the elapse of a period tdelay following transition of the signal level of the signal MDATA from Hi to Lo. Thus, the A/D conversion circuit 320 according to the present embodiment can provide the same effects as those of the first embodiment.

Further, according to the present embodiment, the A/D conversion circuit 320 includes a plurality of sets of two columns of the comparators 140 with a corresponding one of the test signal generation circuits 1000. In the A/D conversion circuit 320 according to the first embodiment, one test signal generation circuit 200 supplies the common signal TEST_LATCH to all of the plurality of column memories 180. In the test signal supply line 205, there are parasitic capacity and parasitic resistance. Thus, the column memories 180 with a longer signal TEST_LATCH transmission route are delayed in the timing of transition of the signal TEST_LATCH from Hi to Lo compared with the column memories 180 with a shorter signal TEST_LATCH transmission route. Similarly, the data signal line 181 also has parasitic capacity and parasitic resistance. Thus, the column memories 180 with a longer signal MDATA transmission route are delayed in the timing of transition of the signal MDATA from Hi to Lo at time t53 compared with the column memories 180 with a shorter signal MDATA transmission route. Accordingly, in the A/D conversion circuit 300 according to the first embodiment, when the degree of signal delay is different between the test signal supply line 205 and the data signal line 181, the length of the period tdelay becomes different among the plurality of column memories 180. As a result, in the A/D conversion circuit 300 according to the first embodiment, the accuracy of the inspection of the column memories 180 may be decreased.

In contrast, in the A/D conversion circuit 320 according to the present embodiment, each of the plurality of test signal generation circuits 1000 generates the signal MLATCH using the signal MDATA supplied to the respectively corresponding column memories 180. Thus, in the A/D conversion circuit 320 according to the present embodiment, the length of the period tdelay can be readily aligned among the plurality of column memories 180. Accordingly, in the A/D conversion circuit 320 according to the present embodiment, the accuracy of the inspection of the column memories 180 can be increased compared with the A/D conversion circuit 300 according to the first embodiment.

In the A/D conversion circuit 320 according to the present embodiment, one test signal generation circuit 1000 is provided for two columns of column memories 180. In the A/D conversion circuit 320, one test signal generation circuit 1000 may be provided for one column of column memory 180. The A/D conversion circuit 320 may include at least two test signal generation circuits 1000. Namely, the number of columns of the plurality of column memories 180 disposed in the A/D conversion circuit 320 may be A (A is an integer of 2 or greater), and one test signal generation circuit 1000 may be provided in correspondence with A-B columns (B is an integer of 1 or greater) of column memories 180. The other one test signal generation circuit 1000 may be provided in correspondence with the B column of column memory 180. In this configuration too, the effect of increasing the accuracy of the inspection of the column memories 180 can be obtained compared with the A/D conversion circuit 300 according to the first embodiment.

(Fourth Embodiment)

An A/D conversion circuit according to the present embodiment and an imaging device including the A/D conversion circuit will be described, mainly focusing on differences from the first embodiment.

Figure 9:
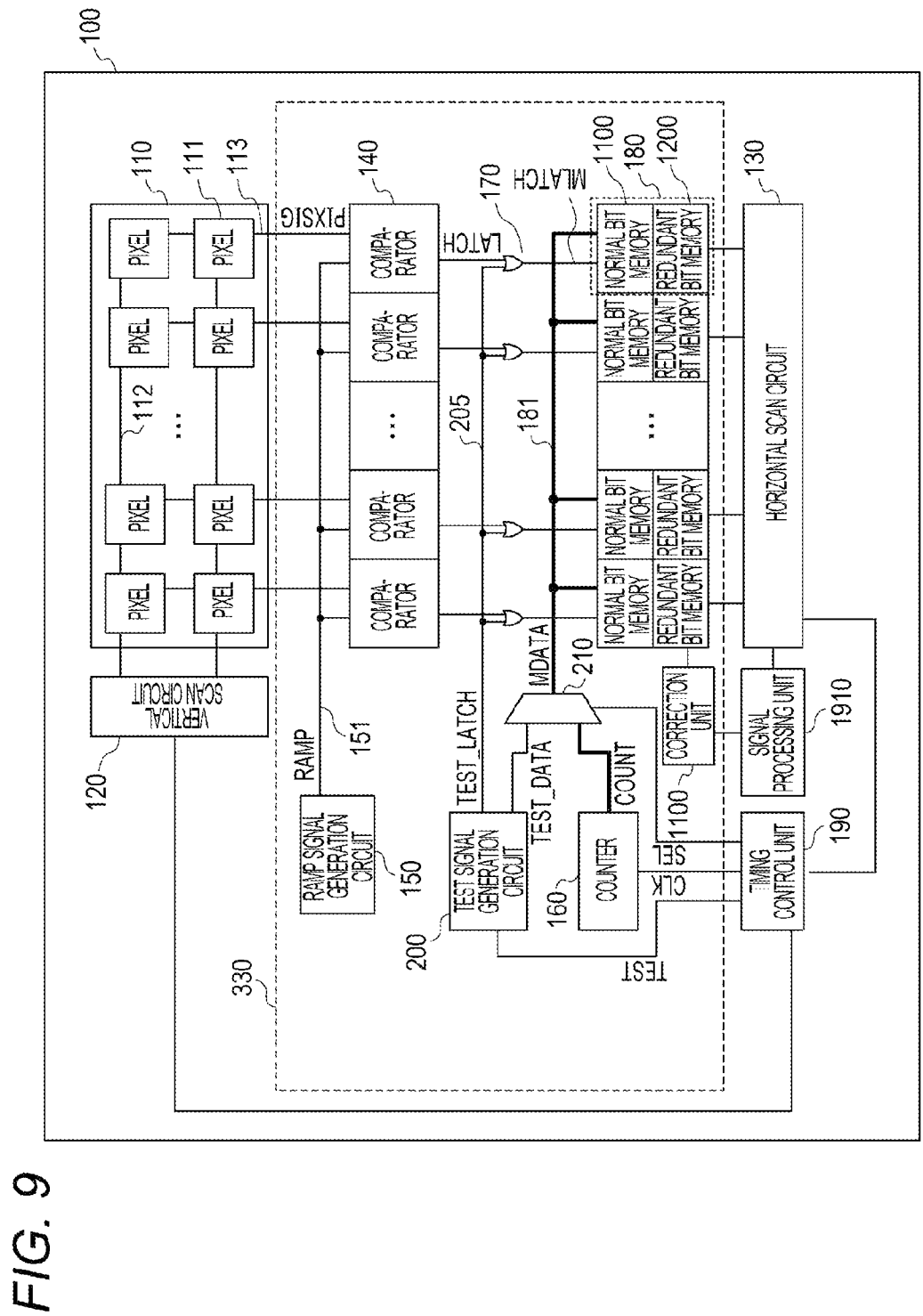
FIG. 9 illustrates an example of the configuration of the A/D conversion circuit and the imaging device.

FIG. 9 illustrates a configuration of the imaging device 100 according to the present embodiment. The imaging device 100 according to present embodiment includes an A/D conversion circuit 330. In the A/D conversion circuit 330, each of the plurality of column memories 180 includes a normal bit memory 1100 and additionally a redundant bit memory 1200. The A/D conversion circuit 330 also includes a correction unit 1110. The imaging device 100 includes a signal processing unit 1910. The function of the signal processing unit 1910 is the same as the function of the signal processing unit 191 according to the first embodiment with the exception that the signal processing unit 1910 supplies a signal to the correction unit 1110.

The operation of the inspection of the column memories 180 in the A/D conversion circuit 330 according to the present embodiment may be the same as the operation illustrated in FIG. 5.

Figure 10:
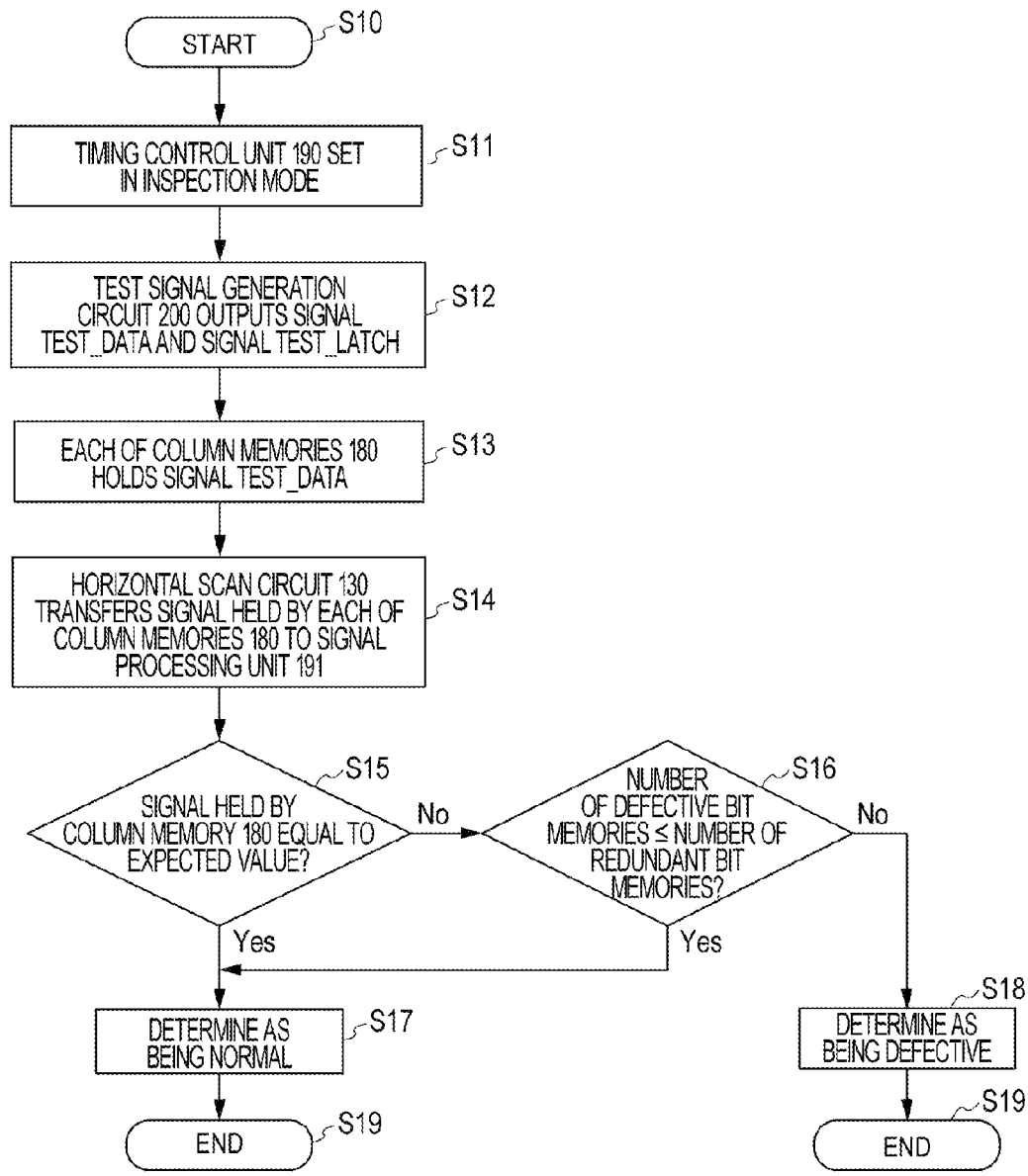
FIG. 10 is a flowchart of an example of inspection mode.

FIG. 10 is a flowchart of inspection of the column memories 180 in the A/D conversion circuit 330 according to the present embodiment. Each of the steps from step S10 to step S15 is the same as each of the steps from step S0 to step S5 shown in FIG. 4.

In step S16, the signal processing unit 1910 detects the number of defective bit memories among the normal bit memories 1100 in each of the plurality of column memories 180 in which the signal level did not change in the predetermined period tdelay. In step S16, it is determined whether the number of defective bit memories is not more than the number of redundant bit memories 1200. With regard to the column memories 180 in which the number of defective bit memories is not more than the number of redundant bit memories 1200, the signal processing unit 1910 supplies to the correction unit 1110 a control signal indicating the number of redundant bit memories 1200 used in the column memories 180. The correction unit 1110 supplies a signal indicating the use of the redundant bit memories 1200 to the column memories 180 in which the number of defective bit memories is not more than the number of redundant bit memories 1200. In response to the signal from the correction unit 1110, the column memories 180 hold the signal MDATA supplied by the selection circuit 210, using the redundant bit memories 1200 instead of the defective bit memory.

In the A/D conversion circuit 330 according to the present embodiment, each of the plurality of column memories 180 includes N (N>1) bit memories combining the normal bit memory 1100 and the redundant bit memory 1200. In each of the plurality of column memories 180, M normal bit memories 1100 are provided so as to hold an M bit (M<N) digital signal. The signal processing unit 1910, with respect to each of the plurality of column memories 180, detects the number of defective bit memories among the M normal bit memories 1100. Then, the signal processing unit 1910 outputs a detection result of the detected number of defective bit memories to the correction unit 1110. The correction unit 1110 then causes at least one of a number N−M of redundant bit memories 1200, instead of the defective bit memories, to hold the digital signal based on an analog signal.

In the A/D conversion circuit 300 according to the first embodiment, when there is a column memory 180 including a defective bit memory, the A/D conversion circuit 300 may be returned to manufacturing process so as to have the column memory 180 repaired. In this case, yield of the A/D conversion circuit 300 may be decreased by the repair of the column memory 180.

In contrast, in the A/D conversion circuit 320 according to the present embodiment, each of the plurality of column memories 180 includes the redundant bit memory 1200. Thus, even when there is a defective bit memory in the column memories 180, the column memories 180 can operate well using the redundant bit memory 1200 instead of the defective bit memory. Thus, the A/D conversion circuit 320 according to the present embodiment can reduce the frequency of repair of the column memories 180 compared with the A/D conversion circuit 300 according to the first embodiment. Accordingly, the A/D conversion circuit 320 according to the present embodiment can increase the yield compared with the A/D conversion circuit 300 according to the first embodiment.

In the present embodiment, an example has been described in which inspection of the redundant bit memory 1200 is omitted. In the following, an example in which the redundant bit memory 1200 and the normal bit memory 1100 are inspected will be described.

The A/D conversion circuit 320 performs step S10 to step S12 described with reference to FIG. 10. Thereafter, in step S13, each of the plurality of column memories 180 holds the signal TEST_DATA using both the normal bit memory 1100 and the redundant bit memory 1200. The A/D conversion circuit 320 then performs step S14. In step S15, the signal processing unit 1910 determines whether, with respect to each of the plurality of column memories 180, the signal level of the signal held by each of the plurality of column memories 180 is equal to the expected value. With respect to the column memory 180 that has held a signal with a signal level different from the expected value, the signal processing unit 1910 performs the following operation instead of step S16 of FIG. 10. The signal processing unit 1910 determines, based on the sum of the number of bits of the normal bit memory 1100 and the number of bits of the redundant bit memory 1200, the number obtained by subtracting the number of bits of the defective bit memory is not more than the number of bits of the redundant bit memory 1200. If the result of determination is "Yes", the signal processing unit 1910 determines, in step S17 of FIG. 10, that the column memory 180 given the "Yes" determination result as being normal. On the other hand, if the determination result is "No", the signal processing unit 1910 determines, in step S18 of FIG. 10, the column memories 180 given the "No" determination result as being defective.

By this inspection, the A/D conversion circuit 320 can conduct inspection as to the presence of a defective bit memory in the redundant bit memory 1200 as well as in the normal bit memory 1100.

(Fifth Embodiment)

Figure 11:
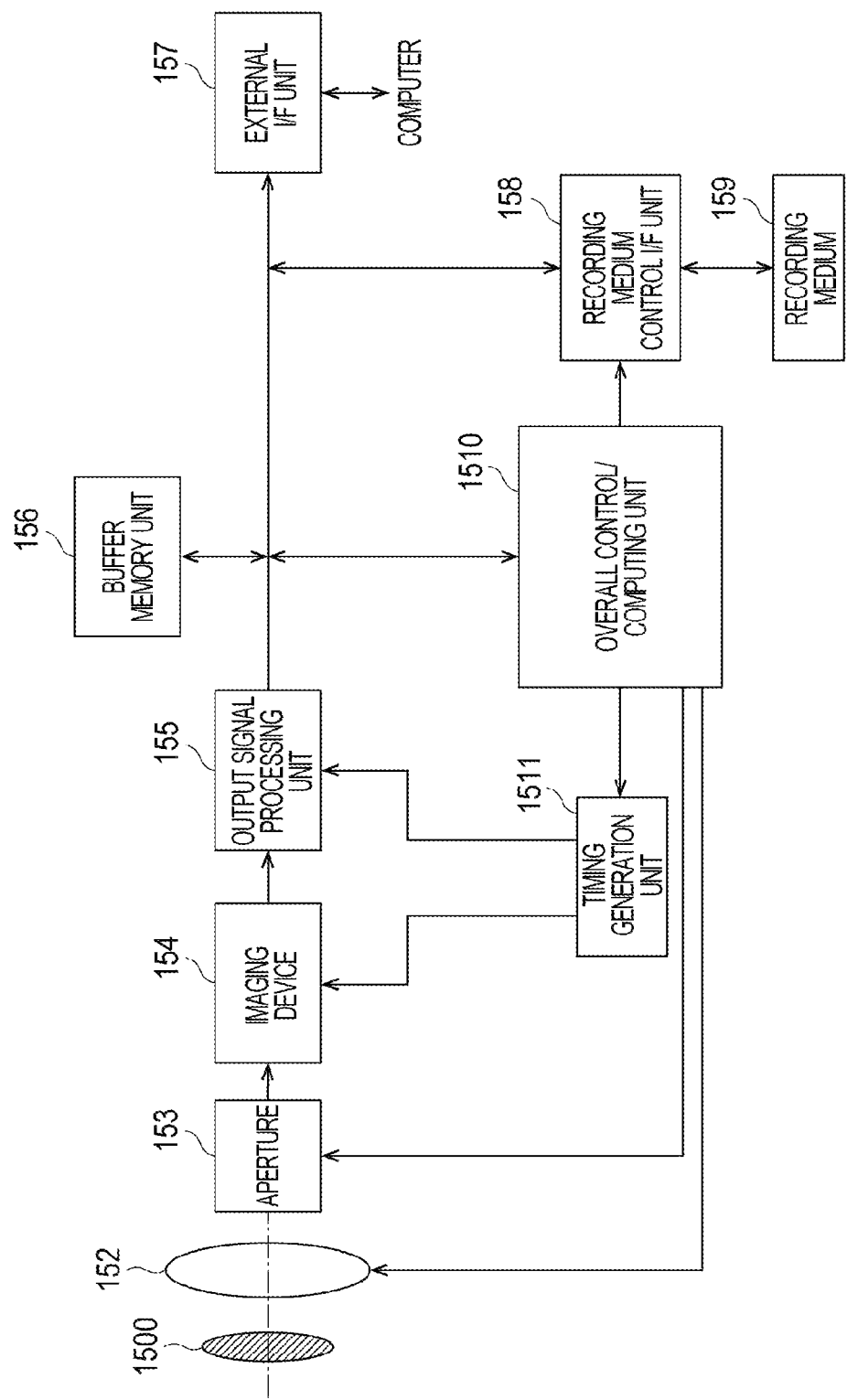
FIG. 11 illustrates an example of the configuration of an imaging system.

The imaging device described with reference to the first to the fourth embodiments can be applied to various imaging systems. Examples of the imaging system include a digital still camera, a digital camcorder, and a monitor camera. FIG. 11 shows a schematic view of an imaging system in which the imaging device according to any of the first embodiment to the fourth embodiment of the present invention is applied to a digital still camera as an example of the imaging system.

The imaging system illustrated in FIG. 11 includes an imaging device 154, a barrier 1500 for lens protection, a lens 152 for forming an optical image of a subject on the imaging device 154, and an aperture 153 for varying the amount of light that passes through the lens 152. The lens 152 and the aperture 153 constitute an optical system for condensing light at the imaging device 154. The imaging system illustrated in FIG. 11 also includes an output signal processing unit 155 that processes an output signal output from the imaging device 154.

The output signal processing unit 155 performs A/D conversion for converting an analog signal output from the imaging device 154 into a digital signal. The output signal processing unit 155 also performs an operation for outputting image data by performing various correction or compression as needed. The imaging system illustrated in FIG. 11 further includes a buffer memory unit 156 for temporary storage of image data, and an external interface unit (external I/F unit) 157 for communication with an external computer and the like. The imaging system further includes a recording medium 159, such as a semiconductor memory, for recording or reading image data, and a recording medium control interface unit (recording medium control I/F unit) 158 for recording or reading the recording medium 159. The recording medium 159 may be built inside the imaging system, or detachable.

Further, the imaging system includes an overall control/computing unit 1510 that performs various computations and controls the digital still camera as a whole, and a timing generation unit 1511 that outputs various timing signals to the imaging device 154 and the output signal processing unit 155. The timing signals and the like may be input from the outside, and the imaging system may include at least the imaging device 154 and the output signal processing unit 155 that processes the output signal output from the imaging device 154. Thus, the imaging system according to the present embodiment can perform an imaging operation by applying the imaging device 154.

A memory of which response to a change in the signal level of a count signal input to the memory does not satisfy desired characteristics can be detected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124751, filed Jun. 17, 2014, which is hereby incorporated by reference herein in its entirety.

What is claimed is:

1. An analog-digital conversion circuit comprising:
   a plurality of comparators configured to output a first signal indicating a result of comparison of an analog signal and a reference signal;
   a first circuit configured to supply a digital signal; and
   a plurality of memories which is provided in correspondence with the plurality of comparators, the plurality of memories being configured to hold the digital signal; and
   a second circuit configured to output a second signal other than the first signal;
   wherein in a first mode, the plurality of memories hold, based on the first signal, the digital signal, and
   wherein in a second mode, the plurality of memories samples the digital signal, a signal level of the digital signal changes from a first level to a second level in a period in which the plurality of memories samples the digital signal, and after the changing of the signal level from the first level to the second level, the plurality of memories holds, based on the second signal, the digital signal.

2. The analog-digital conversion circuit according to claim 1, wherein
   each of the plurality of memories includes N (N > 1) bit memories,
   the digital signal is a digital signal of M bits (M < N), and
   the N bit memories of the plurality of memories hold the digital signal of M bits.

3. The analog-digital conversion circuit according to claim 2, wherein, among the plurality of memories, in the memory that has held a signal of a signal level different from the signal level of the digital signal,
   when the number of bit memories that have held the signal level different from the signal level of the digital signal is not more than a difference between N and M,
   the digital signal is held using, instead of the bit memory among the N bit memories that has held the signal level different from the signal level of the digital signal, the bit memory among the N bit memories that has held the same signal level as the signal level of the digital signal.

4. The analog-digital conversion circuit according to claim 1, wherein
   each of the plurality of memories includes N (N > 1) bit memories, and
   in the first mode, M (N > M ≥ 1) bit memories of the N bit memories hold the digital signal.

5. The analog-digital conversion circuit according to claim 4, wherein, in the second mode, a bit memory not included in the M bit memories but included in the N bit memories does not hold a signal level corresponding to the second level.

6. The analog-digital conversion circuit according to claim 1,
   wherein in the second mode, a signal level of the digital signal changes from the second level to the first level in another period in which the plurality of memories samples the digital signal, and
   after the changing of the signal level from the second level to the first level, the plurality of memories holds, based on the second signal, the digital signal.

7. The analog-digital conversion circuit according to claim 1, wherein a length of a period from the changing of the signal level of the digital signal to the holding of the digital signal is variable.

8. The analog-digital conversion circuit according to claim 1,
comprising a first unit and a second unit,
wherein the first circuit supplies the digital signal to the plurality of memories in common,
wherein the first unit causes a first part of the plurality of memories to hold the digital signal on the basis of a timing of the change of the signal level of the digital signal input to the first part of the plurality of memories, and
wherein the second unit causes a second part of the plurality of memories to hold the digital signal on the basis of a timing of change in the signal level of the digital signal input to the second part of the plurality of memories.

9. The analog-digital conversion circuit according to claim 1, wherein, in the second mode, a timing of the changing of the signal level and a timing of the holding are synchronized with the same clock signal.

10. The analog-digital conversion circuit according to claim 1, wherein the digital signal supplied by the first circuit when the plurality of memories hold is compared with a signal held by each of the plurality of memories.

11. An imaging device comprising:
the analog-digital conversion circuit according to claim 1; and
a plurality of pixels disposed in a matrix,
wherein each of the plurality of comparators is disposed in correspondence with a column in which the plurality of pixels is disposed.

12. The imaging device according to claim 11, further comprising a signal processing unit,
wherein the signal processing unit compares a signal level of the digital signal after the changing of the signal level with a signal level of the digital signal held by each of the plurality of memories in the second mode.

13. An imaging system comprising:
the imaging device according to claim 11; and
an output signal processing unit,
wherein the output signal processing unit generates an image on the basis of a signal output by the imaging device.

14. The analog-digital conversion circuit according to claim 1, wherein a signal level of the reference signal changes with an elapse of time, and
in the first mode, a signal level of the digital signal held by each of the plurality of memories corresponding to a length of a period between a start of change in a signal level of the reference signal and a change in a signal level of the first signal.

15. The analog-digital conversion circuit according to claim 1, further comprising a counter,
wherein, in the first mode, the first circuit receives a first digital signal from the counter and output the first digital signal as the digital signal, and
wherein, in the second mode, the first circuit receives a second digital signal from a circuit other than the counter and output the second digital signal as the digital signal.

16. The analog-digital conversion circuit according to claim 1, further comprising a third circuit configured to receive the first signal and a second signal, and to supply to at least one of the plurality of memories a signal for causing the at least one of the plurality of memories to hold the digital signal.

17. A method of driving an analog-digital conversion circuit:
wherein the analog-digital conversion circuit including:
a plurality of comparators each configured to output a comparison result signal indicating a result of comparison of an analog signal and a reference signal; and
a plurality of memories which is provided in correspondence with the plurality of comparators, the plurality of memories configured to hold a digital signal,
wherein the method comprising:
a first mode for an analog-digital conversion, in the first mode, the plurality of memories configured to hold, based on the comparison result signal, a first digital signal; and
a second mode for an inspection of the analog-digital conversion circuit,
wherein the second mode comprising:
supplying a second digital signal other than the first digital signal to the plurality of memories;
causing the plurality of memories to sample the second digital signal;
changing a signal level of the second digital signal from a first level to a second level in a period in which the plurality of memories is sampling the second digital signal; and
after the changing, causing the plurality of memories to hold the second digital signal.

18. A method of driving an analog-digital conversion circuit method:
wherein the analog-digital conversion circuit including:
a plurality of comparators each configured to output a comparison result signal indicating a result of comparison of an analog signal and a reference signal; and
a plurality of memories which is provided in corresponding with the plurality of comparators, the plurality of memories configured to hold, on a basis of at least the comparison result signal, a digital signal,
wherein the method comprising:
supplying a digital signal to the plurality of memories;
causing the plurality of memories to sample the digital signal;
changing a signal level of the digital signal from a first level to a second level in a period in which the plurality of memories is sampling the digital signal; and
after the changing, causing the plurality of memories to hold the digital signal; and
comparing the second level with a signal level of a digital signal held by each of the plurality of memories.

19. The analog-digital conversion circuit method according to claim 18, comprising determining a defective memory among the plurality of memories, wherein the second signal level does not agree with a signal level of the digital signal held by the defective memory.

20. The method according to claim 17, wherein a signal level of the reference signal changes with an elapse of time, and
in the first mode, a signal level of the first digital signal held by each of the plurality of memories corresponds to a length of a period between a start of change in a signal level of the reference signal and a change in a signal level of the comparison result signal.

* * * * *